(12) United States Patent
Zhang et al.

(10) Patent No.: US 12,527,120 B2
(45) Date of Patent: Jan. 13, 2026

(54) LIGHT PROJECTION CHIP FOR MICRO LED AND MANUFACTURING METHOD THEREOF

(71) Applicant: Fujian Prima Optoelectronics Co., Ltd., Fujian (CN)

(72) Inventors: Fan Zhang, Fujian (CN); Tingfang Zhang, Fujian (CN); Yongsheng Wu, Fujian (CN)

(73) Assignee: Fujian Prima Optoelectronics Co., Ltd., Fuzhou (CN)

( * ) Notice: Subject to any disclaimer, the term of this patent is extended or adjusted under 35 U.S.C. 154(b) by 380 days.

(21) Appl. No.: 18/142,044

(22) Filed: May 2, 2023

(65) Prior Publication Data

US 2023/0352616 A1    Nov. 2, 2023

Related U.S. Application Data

(63) Continuation of application No. PCT/CN2022/097040, filed on Jun. 6, 2022.

(30) Foreign Application Priority Data

Apr. 29, 2022   (CN) .................... 202210473461.5

(51) Int. Cl.
*H10H 20/01* (2025.01)
*H01L 25/16* (2023.01)
*H10H 20/855* (2025.01)

(52) U.S. Cl.
CPC ......... *H10H 20/018* (2025.01); *H01L 25/167* (2013.01); *H10H 20/855* (2025.01); *H10H 20/0363* (2025.01)

(58) Field of Classification Search
CPC ............... H10H 20/018; H10H 20/855; H10H 20/0363; H01L 25/167
See application file for complete search history.

(56) References Cited

U.S. PATENT DOCUMENTS

| 9,583,678 | B2 * | 2/2017 | Cich | ........................ F21V 29/70 |
| 9,831,388 | B2 * | 11/2017 | Cich | .................... H10H 20/856 |
| 10,115,865 | B2 * | 10/2018 | Cich | .................... H10H 20/825 |
| 10,693,041 | B2 * | 6/2020 | Cich | .................... H10H 20/825 |
| 11,309,464 | B2 * | 4/2022 | Lutgen | ..................... G02B 9/16 |

(Continued)

FOREIGN PATENT DOCUMENTS

| CN | 104617121 | A |   | 5/2015 |   |
| CN | 107086260 | A | * | 8/2017 | ....... H10H 20/01335 |

(Continued)

*Primary Examiner* — Laura M Menz

(57) ABSTRACT

The invention discloses a light projection chip for a Micro LED and a manufacturing method thereof. A one-piece lens is fabricated on the basis of a substrate according to a pre-set array pattern on a side of the substrate of a wafer away from a metal electrode, so that the chip can be integrated with the lens without using an additional lens or an optical component. Furthermore, an integrated chip can be obtained by cutting the wafer. A chip with a high integration degree, a high pixel density and a small volume can be obtained by multiple sub-pixels on the integrated chip. Each pixel on the chip corresponds to the driving base, so that the effects of adjustable resolution and free pixel partitioning are achieved by the driving design.

4 Claims, 3 Drawing Sheets

(56) References Cited

U.S. PATENT DOCUMENTS

| | | | |
|---|---|---|---|
| 11,784,288 B2* | 10/2023 | Leung | H10H 20/818 257/103 |
| 2015/0155439 A1* | 6/2015 | Cich | H10H 20/825 362/296.09 |
| 2017/0141268 A1* | 5/2017 | Cich | H10H 20/819 |
| 2018/0053878 A1* | 2/2018 | Cich | H10H 20/825 |
| 2019/0165212 A1* | 5/2019 | Cich | H10H 20/81 |
| 2019/0172674 A1* | 6/2019 | Dou | H01J 37/065 |
| 2020/0135977 A1* | 4/2020 | Leung | G02B 3/04 |
| 2021/0050480 A1* | 2/2021 | Cich | H10H 20/817 |
| 2021/0111319 A1* | 4/2021 | Lutgen | H10H 20/84 |
| 2023/0135964 A1* | 5/2023 | Zhang | H10H 20/8514 257/13 |
| 2023/0136566 A1* | 5/2023 | Wu | H01L 25/0753 257/79 |
| 2023/0246060 A1* | 8/2023 | Zhang | H10H 20/856 438/28 |
| 2023/0352616 A1* | 11/2023 | Zhang | H10H 29/0363 |
| 2024/0396288 A1* | 11/2024 | Heikman | H01S 5/320275 |
| 2025/0275326 A1* | 8/2025 | Zhang | H10H 29/011 |

FOREIGN PATENT DOCUMENTS

| | | | | | |
|---|---|---|---|---|---|
| CN | 210536818 U | | 5/2020 | | |
| CN | 111312068 A | * | 6/2020 | | H10H 20/855 |
| CN | 112289899 A | * | 1/2021 | | H10H 20/855 |
| CN | 112289899 B | * | 4/2022 | | H10H 20/855 |
| CN | 114899182 A | * | 8/2022 | | H01L 23/373 |
| CN | 114937731 A | * | 8/2022 | | H01L 25/167 |
| CN | 114937731 B | * | 4/2023 | | H10H 20/857 |
| CN | 116504882 A | * | 7/2023 | | H10H 20/857 |
| CN | 117912376 A | * | 4/2024 | | G02B 3/0056 |
| EP | 3220429 A1 | * | 9/2017 | | H10H 20/856 |
| EP | 4293734 A1 | * | 12/2023 | | H10H 29/855 |
| GB | 2596570 A | * | 1/2022 | | H10H 20/857 |
| KR | 20210013738 A | * | 2/2021 | | G06Q 50/184 |
| KR | 20210014705 A | * | 2/2021 | | G06Q 50/10 |
| WO | WO-2015120192 A1 | * | 8/2015 | | H10H 20/856 |
| WO | WO-2016079505 A1 | * | 5/2016 | | H01L 25/167 |
| WO | WO-2023206713 A1 | * | 11/2023 | | H10H 20/857 |

* cited by examiner

LIGHT PROJECTION CHIP FOR MICRO LED AND MANUFACTURING METHOD THEREOF

CROSS REFERENCE TO RELATED APPLICATIONS

The present application is a Continuation Application of PCT Application No. PCT/CN2022/097040 filed on Jun. 6, 2022, which claims the benefit of Chinese Patent Application No. 2022104734615 filed on Apr. 29, 2022. All the above are hereby incorporated by reference in their entirety.

TECHNICAL FIELD

The invention relates to the field of semiconductor electronics, and more particularly to a light projection chip for a Micro LED and a manufacturing method thereof.

BACKGROUND ART

At present, micro LED has the following three advantages: 1, high brightness; 2, long lifetime, high reliability, and high environmental resistance. However, there is no case that the Micro LED is applied to the vehicle projection display. A single-point large-size LED is mostly used for the existing vehicle projection light sources, which has low integration, poor pixel density, large occupied volume and needs to be equipped with more optical components such as lenses.

SUMMARY OF THE INVENTION

The technical problems to be solved by the invention are directed to provide a light projection chip for a Micro LED and a manufacturing method thereof, which can reduce the demand for an optical component of the light projection chip and improve the resolution of vehicle projection.

In order to solve the technical problems, the technical solution provided by the invention is as follows.

A manufacturing method of a light projection chip for a Micro LED comprises the steps of:
successively preparing a conductive layer and a protective layer on a wafer according to a pre-set array pattern and evaporating a metal electrode;
fabricating a substrate into a lens according to the pre-set array pattern on a side of the substrate of the wafer away from the metal electrode;
cutting an etched wafer to obtain an integrated chip with the lens; and
welding an electrode of the integrated chip and a driving base via a welding material to obtain a light projection chip.

In order to solve the technical problems, the other technical solution provided by the invention is as follows.

A light projection chip for a Micro LED comprises an integrated chip, a welding material and a driving base;
the integrated chip comprises a substrate and a plurality of sub-pixels located on the surface of the substrate;
a side of the substrate away from the sub-pixel is a lens shape etched according to a pre-set array pattern;
the sub-pixels are arranged according to the pre-set array pattern, and a bonding pad is provided at the position of each sub-pixel on the substrate surface;
the bonding pad is connected to the driving base via the bonding material;

The invention has advantageous effects in that the substrate is fabricated into the lens according to a pre-set array pattern on a side of the substrate of a wafer away from a metal electrode, so that the chip can be integrated with the lens without using an additional lens or an optical component. Furthermore, an integrated chip can be obtained by cutting the wafer. A chip with a high integration degree, a high pixel density and a small volume can be obtained by multiple sub-pixels on the integrated chip. Each pixel on the chip corresponds to the driving base, so that the effects of adjustable resolution and free pixel partitioning are achieved by the driving design.

Figure 1:
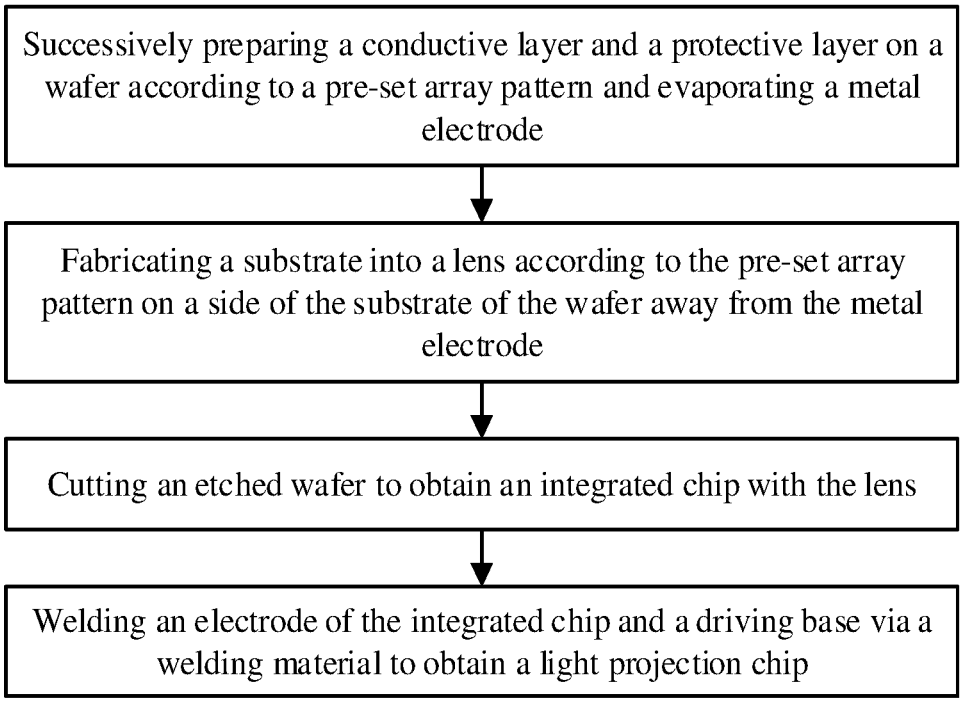
FIG. 1 is a flow chart of a manufacturing method of a light projection chip for a Micro LED in an embodiment of the invention.

DESCRIPTION OF REFERENCE NUMERALS 1, pixel array; 2, bonding pad; 3, sub-pixel; 4, substrate; 5, lens; 6, integrated chip; 7, welding material; 8, driving base; 9, light projection chip mounting position; 10, projection region, 11, silicon oxide layer.

DETAILED DESCRIPTION OF THE INVENTION

In order to explain the technical contents, achieved objects and effects of the invention in detail, it is described in combination with the detailed description and the accompanying drawings.

With reference to FIG. 1, an embodiment of the invention provides a manufacturing method of a light projection chip for a Micro LED, including the steps of:
successively preparing a conductive layer and a protective layer on a wafer according to a pre-set array pattern and evaporating a metal electrode;
fabricating a substrate into a lens according to the pre-set array pattern on a side of the substrate of the wafer away from the metal electrode;
cutting an etched wafer to obtain an integrated chip with the lens; and
welding an electrode of the integrated chip and a driving base via a welding material to obtain a light projection chip.

As apparent from the above description, the invention has advantageous effects in that the substrate is fabricated into the lens according to a pre-set array pattern on a side of the substrate of a wafer away from a metal electrode, so that the chip can be integrated with the lens without using an additional lens or an optical component. Furthermore, an integrated chip can be obtained by cutting the wafer. A chip with a high integration degree, a high pixel density and a small volume can be obtained by multiple sub-pixels on the integrated chip. Each pixel on the chip corresponds to the driving base, so that the effects of adjustable resolution and free pixel partitioning are achieved by the driving design.

Further, before the successively preparing a conductive layer and a protective layer on a wafer according to a pre-set array pattern and evaporating a metal electrode, the method includes:

arranging a pixel array of the chip on the wafer according to the arrangement of the driving base, and integrating a plurality of LED self-emitting pixels into the chip of the wafer according to the pre-set array pattern of the pixel array.

It can be seen from the above description that by directly integrating a pixel array on a wafer, it is possible to integrate a plurality of high-brightness LED self-emitting pixels into one chip, and it is possible to improve the pixel density and the degree of integration without separately soldering each chip.

Further, the fabricating a substrate into a lens according to the pre-set array pattern on a side of the substrate of the wafer away from the metal electrode includes:

grinding and polishing a side of the substrate of the wafer away from the metal electrode, and etching the substrate according to the pre-set array pattern to fabricate the substrate into the lens.

It can be seen from the above description that using a substrate to make a lens enables a chip to integrate a lens instead of an additional lens or an optical component, thereby reducing redundant connection lines. Also, using a substrate to make a lens can also improve the corrosion resistance and acid-alkali resistance of the lens.

Further, after the fabricating the substrate into the lens, the method further includes:

depositing a silicon oxide layer on the lens, and etching the silicon oxide layer and adjusting the morphology of the lens.

It can be seen from the above description that performing secondary deposition and secondary etching on the lens can adjust the morphology of the lens to a desired aspect ratio and tip angle.

Furthermore, the fabricating a substrate into a lens according to the pre-set array pattern on a side of the substrate of the wafer away from the metal electrode further includes:

depositing a silicon oxide layer on a side of a substrate of the wafer away from the metal electrode, etching the substrate and the silicon oxide layer according to the pre-set array pattern, and fabricating a lens based on the substrate and the silicon oxide layer.

It can be seen from the above-mentioned description that depositing the silicon oxide layer on the substrate and performing patterned etching on the substrate and the silicon oxide layer at the same time can obtain a lens made of a composite substrate, thereby strengthening a projection structure of the chip.

Figure 2:
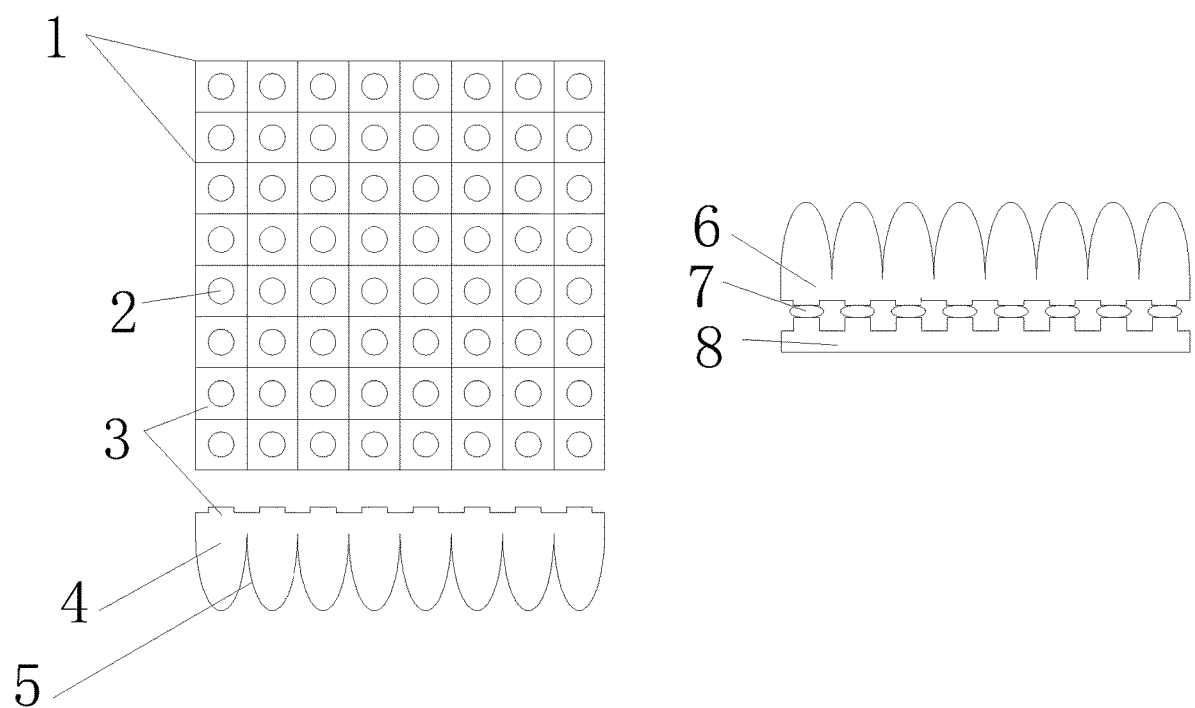
FIG. 2 is a structure diagram of a light projection chip for a Micro LED with a lens fabricated by a substrate according to an embodiment of the invention.

Referring to FIG. 2, another embodiment of the invention provides a light projection chip for a Micro LED including an integrated chip, a welding material and a driving base;

the integrated chip comprises a substrate and a plurality of sub-pixels located on the surface of the substrate;

a side of the substrate away from the sub-pixel is a lens shape etched according to a pre-set array pattern;

the sub-pixels are arranged according to the pre-set array pattern, and a bonding pad is provided at the position of each sub-pixel on the substrate surface;

the bonding pad is connected to the driving base via the bonding material;

It can be seen from the above-mentioned description that the substrate is fabricated into the lens according to a pre-set array pattern on a side of the substrate of a wafer away from a metal electrode, so that the chip can be integrated with the lens without using an additional lens or an optical component. Furthermore, an integrated chip can be obtained by cutting the wafer. A chip with a high integration degree, a high pixel density and a small volume can be obtained by multiple sub-pixels on the integrated chip. Each pixel on the chip corresponds to the driving base, so that the effects of adjustable resolution and free pixel partitioning are achieved by the driving design.

Further, a silicon oxide layer is deposited on the side of the substrate away from the sub-pixel, and the side of the substrate away from the sub-pixel is a lens shape obtained by etching the substrate and the silicon oxide layer according to the pre-set array pattern.

It can be seen from the above-mentioned description that depositing the silicon oxide layer on the substrate and performing patterned etching on the substrate and the silicon oxide layer at the same time can obtain a lens made of a composite substrate, thereby strengthening a projection structure of the chip.

Further, the lens-shaped side of the substrate away from the sub-pixel is provided with a silicon oxide layer having a lens-shaped surface.

It can be seen from the above description that performing secondary deposition and secondary etching on the lens can adjust the morphology of the lens to a desired aspect ratio and tip angle.

Further, the lens shape has a bottom width of 10-200 um and a height of 50-500 um.

Further, the silicon oxide layer has a thickness of 10 to 300 μm.

It can be seen from the above description that the morphology of the lens can be adjusted by depositing the silicon oxide layer, thereby improving the flexibility of lens fabrication.

The above-mentioned light projection chip for the Micro LED and the manufacturing method thereof of the invention are suitable for use as a high-definition projection light source for a vehicle, and are described in the following specific embodiments:

Embodiment I

With reference to FIG. 1, a manufacturing method of a light projection chip for a Micro LED comprises the steps of:

S1, arranging a pixel array 1 of the chip on the wafer according to the arrangement of the driving base 8, and integrating a plurality of LED self-emitting pixels into the chip of the wafer according to the pre-set array pattern of the pixel array 1.

Here, 9 to 1 million high-brightness LED self-emitting pixels can be integrated into one chip. The chip volume depends on the number of pixels. The pixel density can reach above 1000 ppi, and the corresponding size is between 20 μm and 2 cm.

S2, successively preparing a conductive layer and a protective layer on a wafer according to a pre-set array pattern and evaporating a metal electrode.

S3, fabricating a substrate 4 into a lens 5 according to the pre-set array pattern on a side of the substrate 4 of the wafer away from the metal electrode.

Here, the lens 5 can be a convex lens for concentrating light or a concave lens for scattering light, and manufacturing the lens 5 includes the following three methods.

1. Fabricating a Lens 5 Using a Substrate 4 a side of the substrate 4 of the wafer away from the metal electrode is ground and polished, and the substrate 4 is etched according to a pre-set array pattern. An integrated lens 5 is fabricated on the basis of the substrate 4.

2. Performing Morphology Adjustment on the Lens 5 Fabricated on the Substrate 4

A side of the substrate 4 of the wafer away from the metal electrode is ground and polished, and the substrate 4 is etched according to the pre-set array pattern to fabricate an integrated lens 5 based on the substrate 4. A silicon oxide layer 11 is deposited on the integral lens 5, and the silicon oxide layer 11 is etched and the morphology of the lens 5 is adjusted.

3. Fabricating the Lens 5 Using the Substrate 4 and the Silicon Oxide Layer 11:

The silicon oxide layer 11 is deposited on a side of the substrate 4 of the wafer away from the metal electrode. The substrate 4 and the silicon oxide layer 11 are etched according to the pre-set array pattern. An integrated lens 5 is fabricated on the substrate 4 and the silicon oxide layer 11.

S4, cutting an etched wafer to obtain an integrated chip 6 with the lens 5.

S5, an electrode of the integrated chip 6 is welded to a driving base 8 via a welding material 7 to obtain a light projection chip.

Embodiment II

This embodiment provides a specific manufacturing method of a light projection chip for a Micro LED. Among them, a substrate 4 is used to fabricate a lens 5. Specifically, Step 11, a GaN epitaxial slice grown on a sapphire substrate 4 is used by a MOCVD device as a base; pattern transfer is performed according to a designed chip pattern by using a photolithography apparatus such as a photolithography machine and a photoresist, and materials; and an N-type layer is fabricated by etching the GaN surface.

Step 12, a conductive layer is evaporated on the above-mentioned wafer; pattern transfer is performed according to a designed chip pattern by using a photolithography apparatus such as a photolithography machine and a photoresist, and materials; and the current spreading layer thin film on the N-type layer is removed by etching.

Step 13, an aluminium oxide and silicon oxide protective layer is deposited on the above-mentioned wafer using an ALD device and a PECVD device; the pattern transfer is performed according to the designed chip pattern by using the photolithography apparatus such as a photolithography machine and a photoresist, and materials; and the protective layer is removed by etching, and the position of the metal electrode is reserved.

Step 14, gluing and photolithography are performed on the above-mentioned wafer, then a metal electrode is evaporated by means of metal evaporation, and then metal stripping is performed, leaving the metal electrode at a predetermined position.

Step 15, referring to FIG. 2, grinding and polishing are performed on the substrate 4 side of the above-mentioned wafer; pattern transfer is performed on the substrate 4 according to a designed microlens array pattern by using a photolithography apparatus such as a photolithography machine and a photoresist; and ICP etching is performed to produce an integrated lens 5. The bottom width of the lens 5 is 10-200 μm, and the height of the lens 5 is 50-300 μm.

Step 16, the wafer is cut to form an integrated Micro LED chip with the lens 5.

Step 17, the above-mentioned chip is welded to the driving base 8 via the welding material 7. The welding surface of the chip is a chip electrode. After welding, the chip electrode surface is located below and is combined with the driving base 8. The lens 5 is located above.

Figure 5:
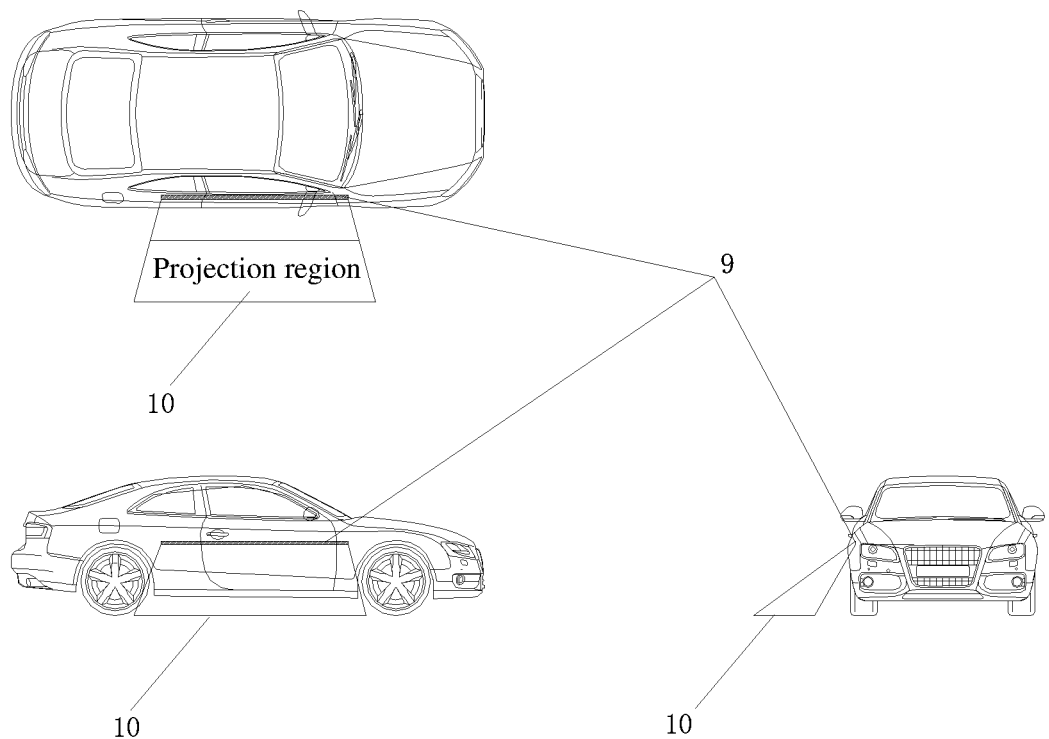
FIG. 5 is an application scene diagram of a light projection chip for a Micro LED according to an embodiment of the invention.

In the above-mentioned method for fabricating a Micro LED light projection chip for a vehicle, referring to FIG. 5, the above-mentioned drive and chip are attached to a light projection chip mounting position 9 such as a vehicle, and the projection effect and the control of the projection pattern can be realized in a projection region 10 by the drive performing power supply and control.

Embodiment III

This embodiment provides a specific manufacturing method for a Micro LED light projection chip. A lens 5 fabricated by a substrate 4 is morphologyly adjusted. Specifically, Step 21, a GaN epitaxial slice grown on a sapphire substrate 4 is used by a MOCVD device as a base; pattern transfer is performed according to a designed chip pattern by using a photolithography apparatus such as a photolithography machine and a photoresist, and materials; and an N-type layer is fabricated by etching the GaN surface.

Step 22, a conductive layer is evaporated on the above-mentioned wafer; the conductive layer can be indium tin oxide or a NiAu alloy metal or molybdenum oxide; the pattern transfer is performed according to the designed chip pattern by using the photolithography apparatus such as a photolithography machine and a photoresist, and materials; the current spreading layer thin film on the N-type layer is removed by etching, and only the conductive layer is reserved on the P—GaN.

Step 23, a titanium oxide and silicon oxide protective layer is deposited on the above-mentioned wafer using a DBR device and a PECVD device; the pattern transfer is performed according to the designed chip pattern by using the photolithography apparatus such as a photolithography machine and a photoresist, and materials; and a conductive through-hole is fabricated under the metal electrode by etching or corrosion, and the position of the metal electrode is reserved.

Step 24, gluing and photolithography are performed on the above-mentioned wafer; the conductive pads 2 are fabricated by means of electron beam evaporation of metal or sputtering of metal, and then metal stripping is performed, leaving metal electrodes at predetermined positions.

Step 25, the substrate 4 side of the wafer is ground and polished. It continues processing on the sapphire surface, and the pattern transfer is performed on the substrate 4 according to a designed microlens array pattern by using a photolithography apparatus such as a photolithography machine and a photoresist.

Step 26, according to the pattern produced in step 25, ICP etching is performed to produce an integrated lens 5. The bottom width of the lens 5 is 10-200 μm, and the height of the lens 5 is 50-500 μm.

Step 27, a second deposition is continued on the surface of the above-mentioned lens 5 by using a ALD or PECVD device, the SiO2 material is deposited, and then a pattern is made by the photolithography machine using the photoresist.

Figure 3:
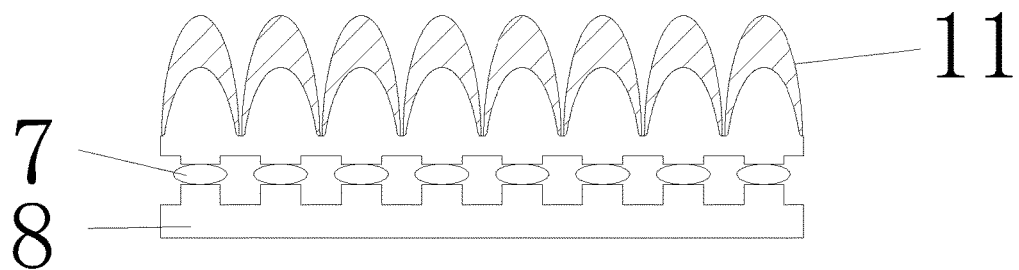
FIG. 3 is a structure diagram illustrating morphology adjustment of the lens fabricated by the substrate in the light projection chip for the Micro LED according to an embodiment of the invention.

Step 28, referring to FIG. 3, the lens 5 is subjected to a second etching that adjusts the morphology of the lens 5 to achieve the desired aspect ratio and tip angle.

Step 29, the wafer is cut to make an integrated Micro LED chip with a lens 5; the above-mentioned chip is welded to the driving base 8 via the welding material 7; the welding surface of the chip is a chip electrode; after welding, the chip electrode surface is located below and is combined with the driving base 8.

Referring to FIG. 5, the above-mentioned drive and chip are attached to a light projection chip mounting position 9 such as a vehicle, and the projection effect and the control of the projection pattern can be realized in a projection region 10 by the drive performing power supply and control.

Embodiment 4

This embodiment provides a specific manufacturing method of a light projection chip for a Micro LED. A lens 5 is fabricated by using a substrate 4 and a silicon oxide layer 11. Specifically, Step 31, a GaN epitaxial slice grown on a sapphire substrate 4 is used by a MOCVD device as a base; pattern transfer is performed according to a designed chip pattern by using a photolithography apparatus such as a photolithography machine and a photoresist, and materials; and an N-type layer is fabricated by etching the GaN surface.

Step 32, a conductive layer is evaporated on the above-mentioned wafer; the conductive layer can be indium tin oxide or a NiAu alloy metal or molybdenum oxide; the pattern transfer is performed according to the designed chip pattern by using the photolithography apparatus such as a photolithography machine and a photoresist, and materials; the current spreading layer thin film on the N-type layer is removed by etching, and only the conductive layer is reserved on the P—GaN.

Step 33, a titanium oxide and silicon oxide protective layer is deposited on the above-mentioned wafer using a DBR device and a PECVD device; the pattern transfer is performed according to the designed chip pattern by using the photolithography apparatus such as a photolithography machine and a photoresist, and materials; and a conductive through-hole is fabricated under the metal electrode by etching or corrosion, and the position of the metal electrode is reserved.

Step 34, gluing and photolithography are performed on the above-mentioned wafer; the conductive pads 2 are fabricated by means of electron beam evaporation of metal or sputtering of metal, and then metal stripping is performed, leaving metal electrodes at predetermined positions.

Figure 4:
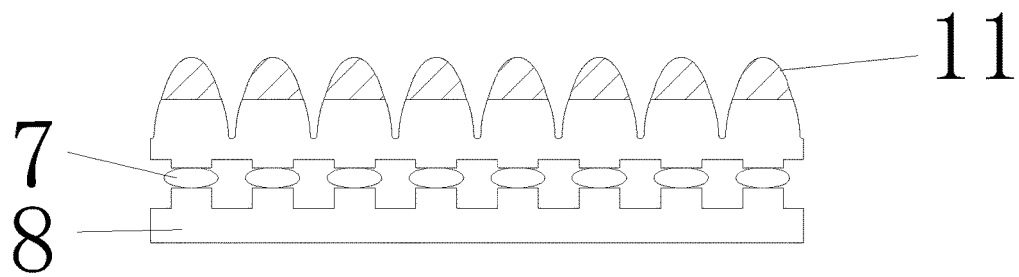
FIG. 4 illustrates the fabrication of a lens using a substrate and a silicon oxide layer in a light projection chip for a Micro LED according to an embodiment of the invention.

Step 35, referring to FIG. 4, the substrate 4 side of the wafer is ground and polished. Silicon oxide is deposited on the sapphire surface, with a thickness ranging from 10 μm to 300 μm. The pattern transfer is performed on the silicon oxide film according to the designed microlens array pattern by using the photolithography apparatus such as a photolithography machine and a photoresist. The silicon oxide film between the two lens patterns is removed by wet etching.

Step 36, ICP etching is performed on the above-mentioned pattern to produce an integrated lens 5. The bottom width of the lens 5 is 10-200 and the height of the lens 5 is 50-500 μm.

Step 37, the wafer is cut to form an integrated Micro LED chip with the lens 5.

Step 38, the above-mentioned chip is welded to the driving base 8 via the welding material 7. The welding surface of the chip is a chip electrode. After welding, the chip electrode surface is located below and is combined with the driving base 8.

Referring to FIG. 5, the above-mentioned drive and chip are attached to a light projection chip mounting position 9 such as a vehicle, and the projection effect and the control of the projection pattern can be realized in a projection region 10 by the drive performing power supply and control.

Embodiment 5

Referring to FIGS. 2-6, a light projection chip for a Micro LED comprises an integrated chip 6, a welding material 7 and a driving base 8.

The integrated chip 6 includes a substrate 4 and a plurality of sub-pixels 3 located on the surface of the substrate 4.

A bonding pad 2 is provided on the substrate surface at the position of each sub-pixel 3, and the bonding pad 2 is connected to a driving base 8 via a bonding material 7.

With reference to FIG. 2, a side of the substrate 4 away from the ion pixel 3 is in the shape of a lens 5 etched according to a pre-set array pattern. Optionally, with reference to FIG. 3, a silicon oxide layer 11 with a lens-shaped surface is deposited on the lens-shaped surface of the side of the substrate 4 away from the ion pixel 3.

In another embodiment, referring to FIG. 4, a silicon oxide layer 11 is deposited on a side of the substrate 4 away from the sub-pixel 3. The side of the substrate 4 away from the sub-pixel 3 is a lens shape obtained by etching the substrate 4 and the silicon oxide layer 11 according to the pre-set array pattern.

Here, the bottom width of the lens shape is 10-200 μm, the height of the lens shape is 50-500 μm, and the thickness of the silicon oxide layer 11 is 10-300 μm.

Figure 6:
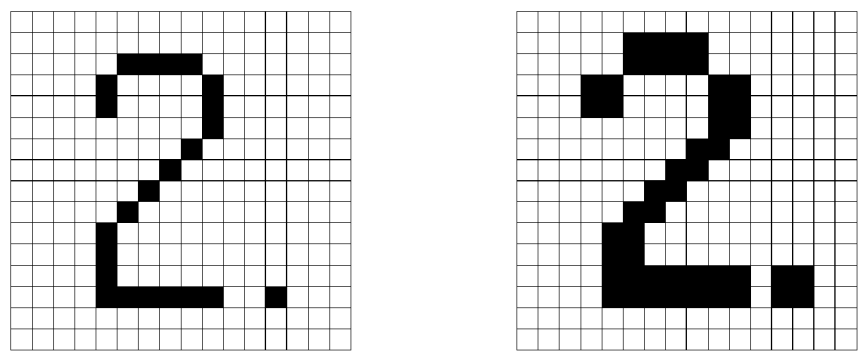
FIG. 6 is a diagram showing a driving effect of a light projection chip for a Micro LED according to an embodiment of the invention.

The projection demonstration effect of placing a light projection chip for a Micro LED on a vehicle is shown in FIG. 5. With reference to FIG. 6, a single-pixel display or a multi-pixel display is realized by a driving design to realize a resolution-adjustable and pixel free-partition light source effect.

In summary, the invention provides a light projection chip for a Micro LED and a manufacturing method thereof. Compared with a conventional chip structure, the invention has the following characteristics. The semiconductor processing is performed on a wafer. A projection light source is compressed to a very small range and has a very high pixel density by integrating a plurality of sub-pixels on the chip. The combination of driving base enables the spot size and shape formed by the projection light source to be more controllable, which can form a combination in real time by software, independent of hardware conditions. The gallium nitride, aluminum oxide and silicon oxide materials used in the manufacturing method of the invention are all materials having a very strong ability to environmental humidity, temperature, acid and alkali. The chip can be directly placed on the outer surface of a basic object such as a vehicle, without the need for other materials to protect or cover. In addition, the integrated matrix chip in the invention is provided with a lens. The chip and the lens are integrated on one substrate. The lens function can be customized at the chip processing stage to achieve light concentration and scattering. The lens can be composed of multiple components. A projection enhancement structure can be formed by combining two or more materials, and the shape and projection effect of the projection lens can be customized.

The above description is only the embodiments of the invention and do not limit the patent scope of the invention. Any equivalent transformations made using the content of the description and drawings of the invention, or the embodiments directly or indirectly applied in related technical fields, are also included in the scope of patent protection of the invention.

What is claimed is:

1. A manufacturing method of a light projection chip for a Micro LED, which is applied to a high-definition projection light source for a vehicle, comprising the steps of:
   successively preparing a conductive layer and a protective layer on a wafer according to a pre-set array pattern and evaporating a metal electrode;
   fabricating a substrate into a lens according to the pre-set array pattern on a side of the substrate of the wafer away from the metal electrode;
   cutting an etched wafer to obtain an integrated chip with the lens; and
   welding an electrode of the integrated chip and a driving base via a welding material to obtain a light projection chip;
   the fabricating a substrate into a lens according to the pre-set array pattern on a side of the substrate of the wafer away from the metal electrode further comprises:
   depositing a silicon oxide layer on a side of a substrate of the wafer away from the metal electrode, etching the substrate and the silicon oxide layer according to the pre-set array pattern, and fabricating a lens based on the substrate and the silicon oxide layer.

2. The manufacturing method of the light projection chip for the Micro LED according to claim 1, wherein before the successively preparing a conductive layer and a protective layer on a wafer according to a pre-set array pattern and evaporating a metal electrode, the method comprises:
   arranging a pixel array of the chip on the wafer according to the arrangement of the driving base, and integrating a plurality of LED self-emitting pixels into the chip of the wafer according to the pre-set array pattern of the pixel array.

3. The manufacturing method of the light projection chip for the Micro LED according to claim 1, wherein the fabricating a substrate into a lens according to the pre-set array pattern on a side of the substrate of the wafer away from the metal electrode comprises:
   grinding and polishing a side of the substrate of the wafer away from the metal electrode, and etching the substrate according to the pre-set array pattern to fabricate the substrate into the lens.

4. The manufacturing method of the light projection chip for the Micro LED according to claim 3, wherein after the fabricating the substrate into the lens, the method further comprises:
   depositing a silicon oxide layer on the lens, and etching the silicon oxide layer and adjusting the morphology of the lens.

\* \* \* \* \*